(12) United States Patent
Khlat et al.

(10) Patent No.: US 12,088,263 B2
(45) Date of Patent: Sep. 10, 2024

(54) EQUALIZER CIRCUIT AND RELATED POWER MANAGEMENT CIRCUIT

(71) Applicant: Qorvo US, Inc., Greensboro, NC (US)

(72) Inventors: Nadim Khlat, Cugnaux (FR); Michael R. Kay, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 582 days.

(21) Appl. No.: 17/412,823

(22) Filed: Aug. 26, 2021

(65) Prior Publication Data
US 2022/0224294 A1 Jul. 14, 2022

Related U.S. Application Data

(60) Provisional application No. 63/135,134, filed on Jan. 8, 2021.

(51) Int. Cl.
| | |
|---|---|
| *H03F 3/45* | (2006.01) |
| *H03F 1/02* | (2006.01) |
| *H03F 3/195* | (2006.01) |
| *H03F 3/24* | (2006.01) |

(52) U.S. Cl.
CPC ........... *H03F 3/245* (2013.01); *H03F 1/0222* (2013.01); *H03F 3/195* (2013.01); *H03F 2200/102* (2013.01); *H03F 2200/451* (2013.01)

(58) Field of Classification Search
CPC ........................................................ H03F 3/45
USPC ................................................. 330/304, 252
See application file for complete search history.

(56) References Cited

U.S. PATENT DOCUMENTS

| | | | |
|---|---|---|---|
| 5,507,171 | A | 4/1996 | Mattes et al. |
| 6,032,109 | A | 2/2000 | Ritmiller, III |
| 6,556,077 | B2 | 4/2003 | Schaffer et al. |
| 6,724,202 | B2 | 4/2004 | Tanizawa |

(Continued)

FOREIGN PATENT DOCUMENTS

| | | |
|---|---|---|
| JP | 60001915 A | 1/1985 |
| WO | 2012151594 A2 | 11/2012 |

OTHER PUBLICATIONS

Written Opinion for International Patent Application No. PCT/US2021/049801, mailed Oct. 12, 2022, 8 pages.

(Continued)

*Primary Examiner* — Henry Choe
(74) *Attorney, Agent, or Firm* — Withrow & Terranova, P.L.L.C.

(57) ABSTRACT

An equalizer circuit and related power management circuit are provided. The power management circuit includes a voltage amplifier circuit configured to generate an envelope tracking (ET) voltage based on a differential target voltage and provide the ET voltage to a power amplifier circuit(s) via a signal path for amplifying a radio frequency signal(s). An equalizer circuit is provided in the power management circuit to equalize the differential target voltage prior to generating the ET voltage. Specifically, the equalizer circuit is configured to provide a transfer function including a second-order complex-zero term and a real-zero term for offsetting a transfer function of an inherent trace inductance of the signal path and an inherent impedance of the voltage amplifier circuit. By employing the second-order transfer function with the real-zero term, it is possible to reduce distortion in the ET voltage, especially when the RF signal(s) is modulated in a wide modulation bandwidth.

20 Claims, 9 Drawing Sheets

(56) References Cited

U.S. PATENT DOCUMENTS

| | | |
|---|---|---|
| 7,616,062 B2 | 11/2009 | Miyamoto et al. |
| 8,649,532 B2 | 2/2014 | Adachi |
| 10,868,499 B2 | 12/2020 | Gorisse et al. |
| 11,387,852 B2 * | 7/2022 | Banin .................. H04L 25/49 |
| 2012/0313701 A1 * | 12/2012 | Khlat .................. H02M 3/07 330/127 |
| 2014/0009227 A1 * | 1/2014 | Kay .................. H03F 3/45475 330/127 |
| 2014/0097895 A1 | 4/2014 | Khlat et al. |
| 2014/0111170 A1 | 4/2014 | Shi et al. |
| 2014/0213196 A1 | 7/2014 | Langer et al. |
| 2014/0266428 A1 | 9/2014 | Chiron et al. |
| 2014/0361837 A1 | 12/2014 | Strange et al. |
| 2015/0031318 A1 | 1/2015 | McCallister |
| 2016/0164550 A1 | 1/2016 | Pilgram |
| 2016/0079943 A1 | 3/2016 | Mallinson |
| 2016/0277045 A1 | 9/2016 | Langer |
| 2019/0020526 A1 | 1/2019 | Khlat et al. |
| 2020/0036338 A1 | 1/2020 | Gorisse et al. |
| 2020/0106392 A1 | 4/2020 | Khlat et al. |
| 2020/0153394 A1 | 5/2020 | Khlat et al. |
| 2020/0259685 A1 | 8/2020 | Khlat et al. |
| 2021/0211112 A1 | 7/2021 | Khlat et al. |
| 2022/0224294 A1 * | 7/2022 | Khlat .................. H03F 3/189 |

OTHER PUBLICATIONS

Non-Final Office Action for U.S. Appl. No. 17/142,350, mailed Sep. 15, 2022, 9 pages.
Non-Final Office Action for U.S. Appl. No. 18/324,683, mailed Feb. 27, 2024, 6 pages.
European Search Report for European Patent Application No. 21217186.2, mailed Jun. 2, 2022, 13 pages.
International Preliminary Report on Patentability for International Patent Application No. PCT/US2021/049801, mailed Jan. 24, 2023, 21 pages.
International Search Report and Written Opinion for International Patent Application No. PCT/US2021/049801, mailed Jan. 4, 2022, 20 pages.
Kelm, Robert, "Understanding Complex-Conjugate Poles in Filter Theory," Technical Article, allaboutcircuits.com/technical-articles/complex-conjugate-poles-in-filter-theory/, Aug. 30, 2016, EETech Media, LLC, 5 pages.
Non-Final Office Action for U.S. Appl. No. 16/199,532, mailed Apr. 17, 2020, 6 pages.
3 Notice of Allowance for U.S. Appl. No. 16/199,532, mailed Aug. 11, 2020, 7 pages.

* cited by examiner

EQUALIZER CIRCUIT AND RELATED POWER MANAGEMENT CIRCUIT

RELATED APPLICATIONS

This application claims the benefit of provisional patent application Ser. No. 63/135,134, filed Jan. 8, 2021, the disclosures of which are hereby incorporated herein by reference in their entireties.

FIELD OF THE DISCLOSURE

The present disclosure is related to an equalizer circuit, and in particular to an equalizer circuit in a power management circuit configured to operate across a wide modulation bandwidth.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as fifth-generation new-radio (5G-NR) technology configured to communicate a millimeter wave (mmWave) radio frequency (RF) signal(s) in an mmWave spectrum located above 12 GHz frequency. To achieve higher data rates, a mobile communication device may employ a power amplifier(s) to increase output power of the mmWave RF signal(s) (e.g., maintaining sufficient energy per bit). However, the increased output power of mmWave RF signal(s) can lead to increased power consumption and thermal dissipation in the mobile communication device, thus compromising overall performance and user experience.

Envelope tracking (ET) is a power management technology designed to improve efficiency levels of power amplifiers to help reduce power consumption and thermal dissipation in mobile communication devices. In an ET system, a power amplifier(s) amplifies an RF signal(s) based on a time-variant ET voltage(s) generated in accordance with time-variant amplitudes of the RF signal(s). More specifically, the time-variant ET voltage(s) corresponds to a time-variant voltage envelope(s) that tracks (e.g., rises and falls) a time-variant power envelope(s) of the RF signal(s). Understandably, the better the time-variant voltage envelope(s) tracks the time-variant power envelope(s), the higher linearity the power amplifier(s) can achieve.

However, the time-variant ET voltage(s) can be highly susceptible to distortions caused by trace inductance and/or load impedance, particularly when the time-variant ET voltage(s) is so generated to track the time-variant power envelope(s) of a high modulation bandwidth (e.g., >200 MHz) RF signal(s). As a result, the time-variant voltage envelope(s) may become misaligned with the time-variant power envelope(s) of the RF signal(s), thus causing unwanted distortions (e.g., amplitude clipping) in the RF signal(s). In this regard, it is desirable to reduce distortions caused by trace inductance and/or load impedance in the time-variant ET voltage(s).

SUMMARY

Embodiments of the disclosure relate to an equalizer circuit and a related power management circuit. The power management circuit includes a voltage amplifier circuit configured to generate an envelope tracking (ET) voltage based on a differential target voltage and provide the ET voltage to a power amplifier circuit(s) via a signal path for amplifying a radio frequency (RF) signal(s). Notably, the voltage amplifier circuit can have an inherent impedance and the signal path can have an inherent trance inductance that can collectively distort the ET voltage. As such, an equalizer circuit is provided in the power management circuit to equalize the differential target voltage prior to generating the ET voltage. Specifically, the equalizer circuit is configured to provide a transfer function including a second-order complex-zero term and a real-zero term for offsetting a transfer function of the inherent trace inductance and the inherent impedance. By employing the second-order transfer function with the real-zero term to offset the inherent trace inductance and the inherent impedance, it is possible to reduce distortion in the ET voltage, especially when the RF signal(s) is modulated in a wide modulation bandwidth (e.g., >200 MHz).

In one aspect, an equalizer circuit is provided. The equalizer circuit includes a voltage input that receives a differential target voltage comprising a negative target voltage and a positive target voltage. The equalizer circuit also includes a voltage output that outputs an equalized target voltage corresponding to the differential target voltage. The equalizer circuit also includes an equalizer tuning circuit coupled between the voltage input and the voltage output. The equalizer tuning circuit is configured to cause the equalized target voltage to be generated from the differential target voltage based on a transfer function comprising a second-order complex-zero term and a real-zero term.

In another aspect, a power management circuit is provided. The power management circuit includes an equalizer circuit. The equalizer circuit includes a voltage input that receives a differential target voltage comprising a negative target voltage and a positive target voltage. The equalizer circuit also includes a voltage output that outputs an equalized target voltage corresponding to the differential target voltage. The equalizer circuit also includes an equalizer tuning circuit coupled between the voltage input and the voltage output. The equalizer tuning circuit is configured to cause the equalized target voltage to be generated from the differential target voltage based on a transfer function comprising a second-order complex-zero term and a real-zero term. The power management circuit also includes a voltage amplifier circuit configured to generate an ET voltage based on the equalized target voltage.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
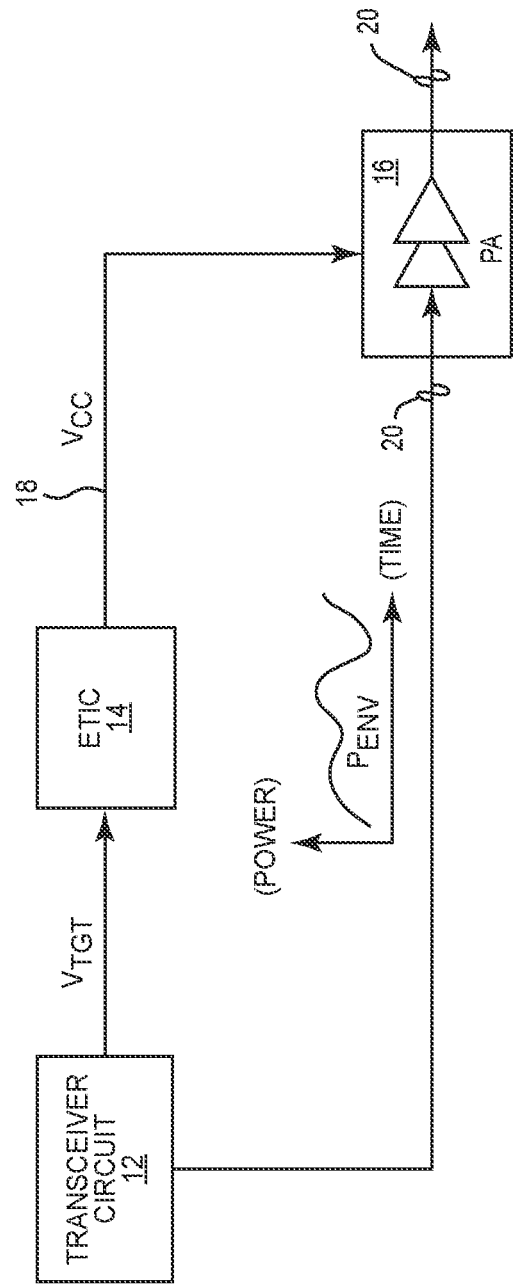
FIG. 1 is a schematic diagram of an exemplary conventional envelope tracking (ET) power amplifier apparatus configured to generate an ET voltage.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to an equalizer circuit and a related power management circuit. The power management circuit includes a voltage amplifier circuit configured to generate an envelope tracking (ET) voltage based on a differential target voltage and provide the ET voltage to a power amplifier circuit(s) via a signal path for amplifying a radio frequency (RF) signal(s). Notably, the voltage amplifier circuit can have an inherent impedance and the signal path can have an inherent trance inductance that can collectively distort the ET voltage. As such, an equalizer circuit is provided in the power management circuit to equalize the differential target voltage prior to generating the ET voltage. Specifically, the equalizer circuit is configured to provide a transfer function having a second-order complex-zero term and a real-zero term for offsetting a transfer function of the inherent trace inductance and the inherent impedance. By employing the second-order transfer function with the real-zero term to offset the inherent trace inductance and the inherent impedance, it is possible to reduce distortion in the ET voltage, especially when the RF signal(s) is modulated in a wide modulation bandwidth (e.g., >200 MHz).

Figure 2:
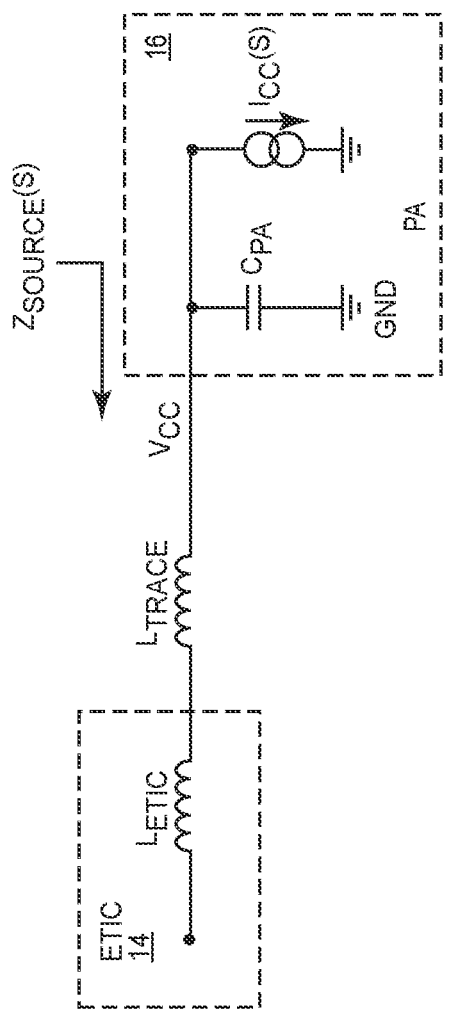
FIG. 2 is a schematic diagram of an exemplary equivalent circuit for illustrating various impedances and/or inductances in the conventional power amplifier apparatus of FIG. 1 that can distort the ET voltage.
Figure 3:
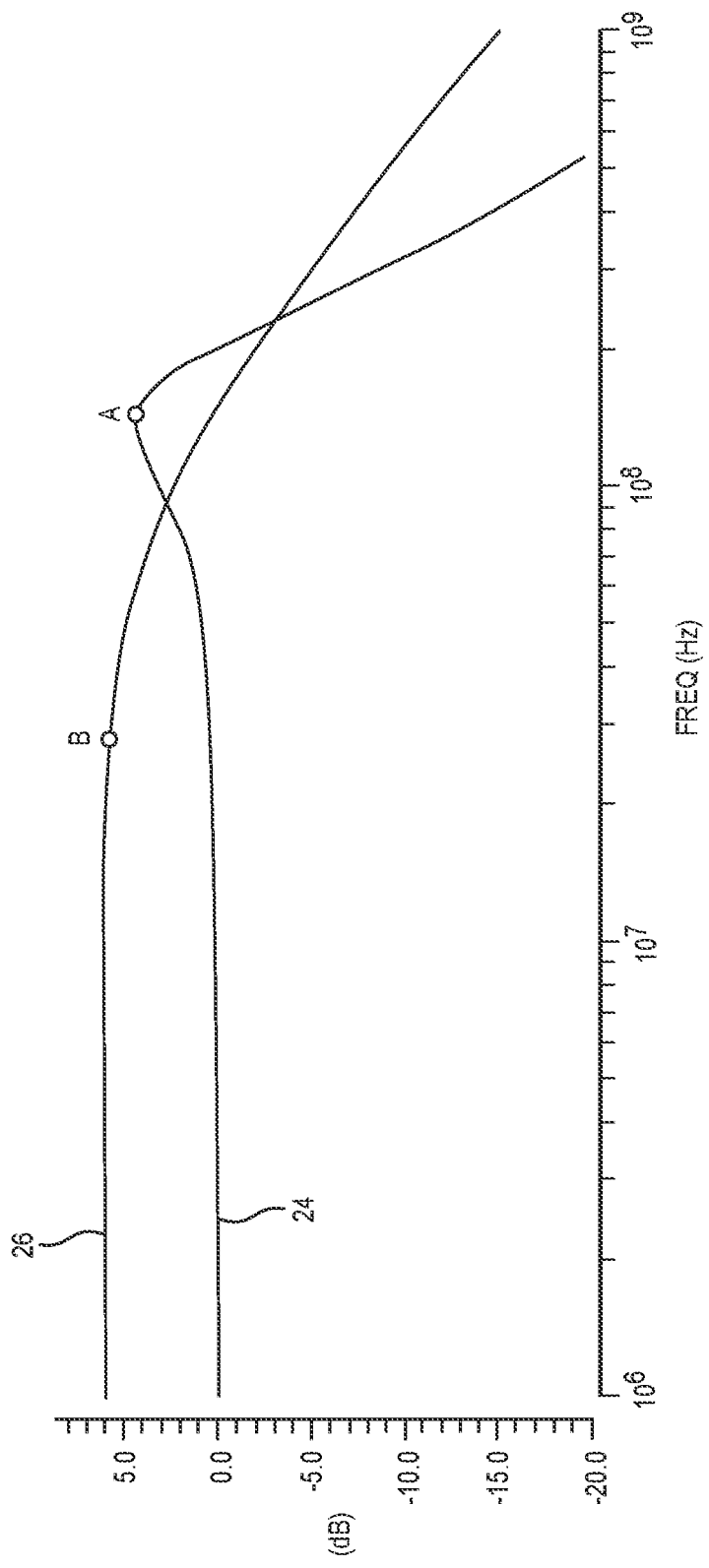
FIG. 3 is a graphic diagram providing an exemplary illustration of factors contributing to a voltage disturbance in the equivalent circuit of FIG. 2 that can distort the ET voltage in FIG. 1.
Figure 4:
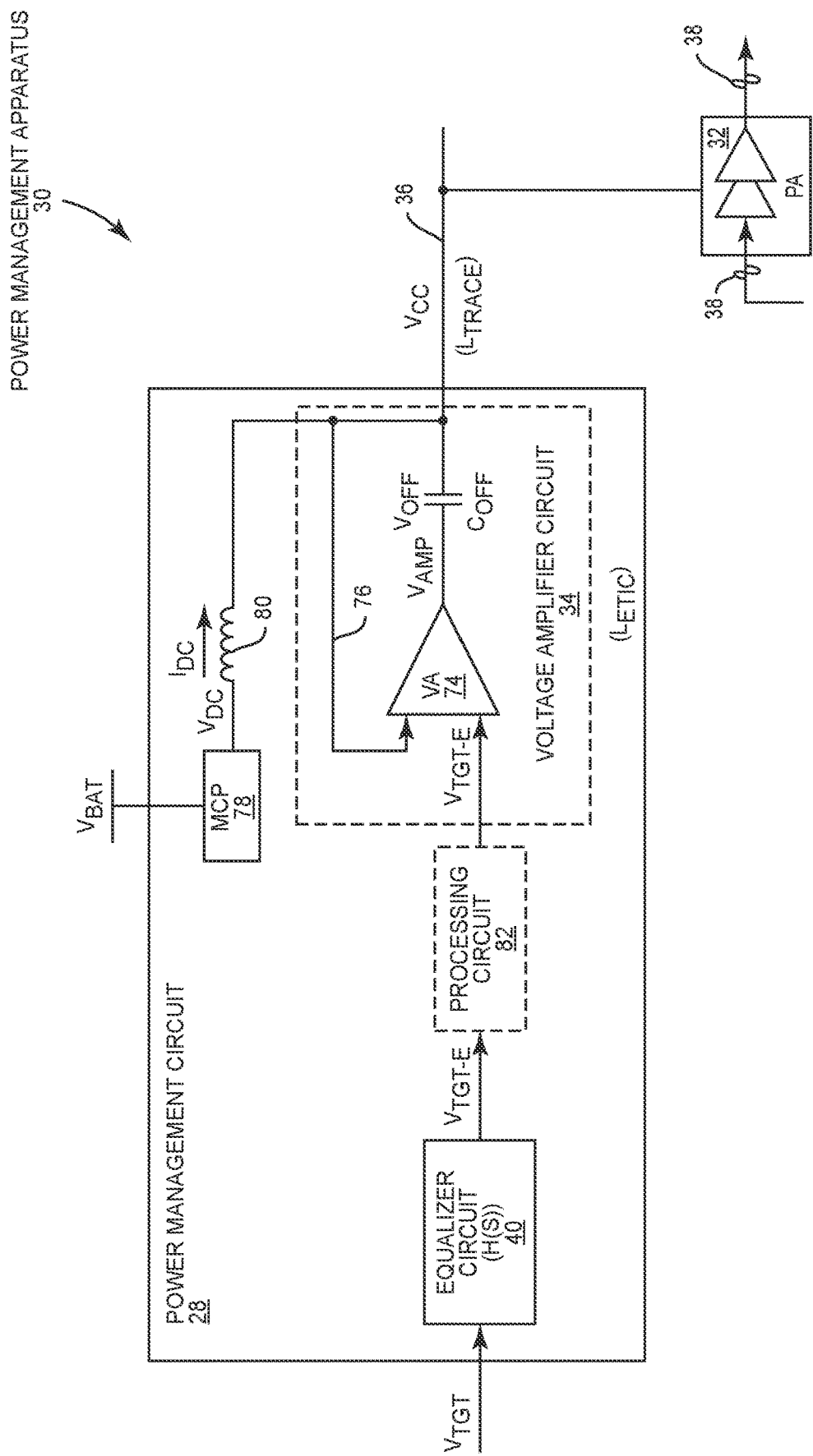
FIG. 4 is a schematic diagram of an exemplary power management circuit configured according to an embodiment of the present disclosure to implement a second-order complex-zero transfer function with a real-zero term to offset voltage disturbance in an ET voltage.

Before discussing the power management circuit and the equalizer circuit incorporated therein according to the present disclosure, starting at FIG. 4, an overview of a conventional ET power management apparatus that can experience ET voltage distortion is first provided with reference to FIGS. 1 to 3.

FIG. 1 is a schematic diagram of an exemplary conventional power management apparatus 10 configured to generate an ET voltage $V_{CC}$. The conventional power management apparatus 10 includes a transceiver circuit 12, an ET integrated circuit (ETIC) 14, a power amplifier circuit 16, and a signal line(s) 18 that couples the ETIC 14 to the power amplifier circuit 16.

The transceiver circuit 12 is configured to generate and provide an RF signal 20, which is associated with a time-variant power envelope $P_{ENV}$, to the power amplifier circuit 16. The transceiver circuit 12 is also configured to generate a target voltage $V_{TGT}$ in accordance with (a.k.a. tracks) the time-variant power envelope $P_{ENV}$. The ETIC 14 is configured to generate the ET voltage $V_{CC}$ based on the target voltage $V_{TGT}$ and the power amplifier circuit 16 is configured to amplify the RF signal 20 based on the ET voltage $V_{CC}$.

Those skilled in the art will appreciate that the power amplifier circuit 16 may operate with improved efficiency and linearity when the ET voltage $V_{CC}$ accurately tracks the power envelope $P_{ENV}$ of the RF signal 20. This is achieved when the ET voltage $V_{CC}$ is temporally aligned with the target voltage $V_{TGT}$. However, temporal alignment between the ET voltage $V_{CC}$ and the target voltage $V_{TGT}$ may be complicated by various impedances and/or inductances presenting in the conventional power management apparatus 10.

To illustrate the various impedances and/or inductances, FIG. 2 is a schematic diagram of an exemplary equivalent circuit 22 for illustrating the various impedances and/or inductances in the conventional power management apparatus 10 of FIG. 1 that can distort the ET voltage $V_{CC}$. Common elements between FIGS. 1 and 2 are shown therein with common element numbers and will not be re-described herein.

In the equivalent circuit 22, the ETIC 14 has an inherent impedance that can be modeled by an equivalent inductance $L_{ETIC}$ and the signal line(s) 20 has an inherent trance inductance that can be modeled by an equivalent trance inductance $L_{TRACE}$. Accordingly, the equivalent circuit 22 would have a total equivalent inductance $L_E$ that equals a sum of the equivalent inductance $L_{ETIC}$ and the equivalent trance inductance $L_{TRACE}$ ($L_E=L_{ETIC}+L_{TRACE}$).

The power amplifier circuit 16 can be modeled as a current source with a modulated current $I_{CC}(s)$ and have a total equivalent capacitance $C_{PA}$. Accordingly, an equivalent source impedance $Z_{SOURCE}(s)$ presented to the current source can be determined as in equation (Eq. 1) below.

$$Z_{SOURCE}(s) = \frac{s*L_E}{1+L_E*C_{PA}*s^2} \quad \text{(Eq. 1)}$$

In the equation (Eq. 1), s represents the s-transform notation, which can be expressed as $s=j2\pi f$. The modulated current $I_{CC}(s)$ is somewhat proportional to the target voltage $V_{TGT}$ and can be expressed as in equation (Eq. 2) below.

$$I_{CC}(s) = \frac{V_{TGT}(s)}{Z_{ICC}(s)*e^{(-s*\Delta D)}} \quad \text{(Eq. 2)}$$

In the equation (Eq. 2) above, $Z_{ICC}(s)$ represents an impedance at a collector (not shown) of the power amplifier circuit 16 and $\Delta D$ represents a group delay between the $V_{TGT}$ and the time-variant power envelope $P_{EVN}$ at an output stage (not shown) of the power amplifier circuit 16.

Notably, the modulated current $I_{CC}$ can create a voltage disturbance across the collector of the power amplifier circuit 16. The voltage disturbance is approximately equal to $Z_{SOURCE}(s)*I_{CC}(s)$. As illustrated and discussed in FIG. 3, the voltage disturbance may primarily be caused by the total equivalent inductance $L_E$. FIG. 3 is a graphic diagram providing an exemplary illustration of factors contributing to the voltage disturbance in the equivalent circuit 22 of FIG. 2 that can distort the ET voltage in FIG. 1.

FIG. 3 illustrates a first transfer function curve 24 and a second transfer function curve 26. Specifically, the first transfer function curve 24 shows a transfer function of the equivalent trace inductance $L_{TRACE}$ that can cause a voltage disturbance in the ET voltage $V_{CC}$. The second transfer function curve 26 shows a transfer function of the equivalent impedance $L_{ETIC}$ that can also cause a voltage disturbance in the ET voltage $V_{CC}$. As shown in FIG. 3, the equivalent trace inductance $L_{TRACE}$ can cause the ET voltage $V_{CC}$ to peak at frequency A and decline sharply thereafter. The equivalent inductance $L_{ETIC}$, on the other hand, can cause the ET voltage $V_{CC}$ to decline starting at frequency B. The changes in the ET voltage $V_{CC}$ (a.k.a. voltage disturbance) caused by the transfer functions of the equivalent trace inductance $L_{TRACE}$ and the equivalent inductance $L_{ETIC}$ can lead to a distortion of the ET voltage $V_{CC}$.

With reference back to FIG. 2, the transfer functions of the equivalent trace inductance $L_{TRACE}$ and the equivalent inductance $L_{ETIC}$ can be generally expressed as H(s) in an s-domain according to Equation (Eq. 3) below:

$$H(s) = \frac{N(s)}{D(s)} \quad \text{(Eq. 3)}$$

In the equation (Eq. 3) above, N(s) and D(s) are simple polynomials that define one or more zeros and one or more poles of the transfer function, respectively, and $s=j2\pi f$. The one or more zeros are the roots of the polynomial equation N(s) and can be determined by solving the equation N(s)=0. The order of the polynomial N(s) determines the number of zeros of the transfer function H(s). Each zero corresponds to a zero output of the transfer function H(s). The polynomial N(s) is a zero-order polynomial when N(s) represents a constant value, is a first-order polynomial when N(s)=1+$b_0$s (where $b_0$ is a constant), is a second-order polynomial when N(s)=1+$b_0$s+$b_1$$s^2$ (where $b_1$ is a constant), and so on. In particular, the transfer function H(s) is further referred to as a real-zero term when N(s) is the first-order polynomial N(s)=1+$b_0$s, or as a second-order complex-zero transfer function when N(s) is the second-order polynomial N(s)=1+$b_0$s+$b_1$$s^2$. Accordingly, a transfer function H(s) with both the second-order complex-zero term (1+$b_0$s+$b_1$$s^2$) and the real-zero term (1+$b_0$s) can be referred to as a second-order complex-zero transfer function with a real-zero term.

In contrast to the zeros, the one or more poles are the roots of the polynomial D(s) and can be determined by solving the equation D(s)=0. The order of the polynomial D(s) determines the number of poles of the transfer function H(s). Each pole corresponds to an infinite output of the transfer function H(s). The polynomial D(s) is a zero-order polynomial when D(s) represents a constant value, is a first-order polynomial when D(s)=1+$a_0$s (where $a_0$ is a constant), is a second-order polynomial when D(s)=1+$a_0$s+$a_1$$s^2$ (where $a_1$ is a constant), and so on. In particular, the transfer function H(s) is further referred to as a real-pole term when D(s) is the first-order polynomial N(s)=1+$a_0$s, or as a second-order complex-pole transfer function when D(s) is the second-order polynomial N(s)=1+$a_0$s+$a_1$$s^2$. Accordingly, a transfer function H(s) with both the second-order complex-pole term (1+$a_0$s+$a_1$$s^2$) and the real-pole term (1+$a_0$s) can be referred to as a second-order complex-pole transfer function with a real-pole term.

Specifically, the transfer function H(s) of the equivalent trace inductance $L_{TRACE}$ can be the second-order complex-pole transfer function and the transfer function H(s) of the equivalent inductance $L_{ETIC}$ can be the real-pole transfer term. Thus, an overall transfer function H(s) of the equivalent trace inductance $L_{TRACE}$ and the equivalent inductance $L_{ETIC}$ can be a second-order complex-pole transfer function H(s) with a real-pole term. In this regard, to reduce or even eliminate the voltage disturbance in the ET voltage $V_{CC}$, it is necessary to implement a second-order complex-zero transfer function H(s) with a real-zero term to offset the second-order complex-pole transfer function H(s) with the real-pole term. Specific embodiments related to creating the second-order complex-zero transfer function N(s) to offset the voltage disturbance are discussed next, starting at FIG. 4.

FIG. 4 is a schematic diagram of an exemplary power management circuit 28 configured according to an embodiment of the present disclosure to implement a second-order complex-zero transfer function H(s) with a real-zero term to offset voltage disturbance in an ET voltage $V_{CC}$. The power management circuit 28 can be provided in a power management apparatus 30 that also includes a power amplifier circuit 32. The power management circuit 28 includes a voltage amplifier circuit 34 configured to generate the ET voltage $V_{CC}$ based on a differential target voltage $V_{TGT}$ and provide the ET voltage $V_{CC}$ to the power amplifier circuit 32 via a signal path 36 (e.g., a conductive trace) for amplifying an RF signal 38.

Notably, the voltage amplifier circuit 34 can have an inherent impedance that can be modeled by the equivalent inductance $L_{ETIC}$ as shown in FIG. 2. Similarly, the signal path 36 can have an inherent trance inductance that can be modeled by the equivalent inductance $L_{TRACE}$ as shown in FIG. 2. Thus, according to previous discussions in FIGS. 2 and 3, the equivalent inductance $L_{ETIC}$ and the equivalent inductance $L_{TRACE}$ can collectively present the second-order complex-pole transfer function H(s) with the real-pole to cause the voltage disturbance to distort the ET voltage $V_{CC}$.

As such, the power management circuit 28 is configured to include an equalizer circuit 40. As discussed in detail below, the equalizer circuit 40 is configured to equalize the differential target voltage $V_{TGT}$ to generate an equalized target voltage $V_{TGT-E}$. Accordingly, the voltage amplifier circuit 34 can be configured to generate the ET voltage $V_{CC}$ based on the equalized target voltage $V_{TGT-E}$.

Specifically, the equalizer circuit 40 is configured to generate the equalized target voltage $V_{TGT-E}$ based on a second-order complex-zero transfer function H(s) with a real-zero term. In this regard, the equalized target voltage $V_{TGT-E}$ can effectively offset the transfer function H(s) of the equivalent trace inductance $L_{TRACE}$ and the equivalent inductance $L_{ETIC}$. As a result, it is possible to eliminate the voltage disturbance in the ET voltage $V_{CC}$, especially when the RF signal 38 is modulated in a wide modulation bandwidth (e.g., >200 MHz).

Figure 5:
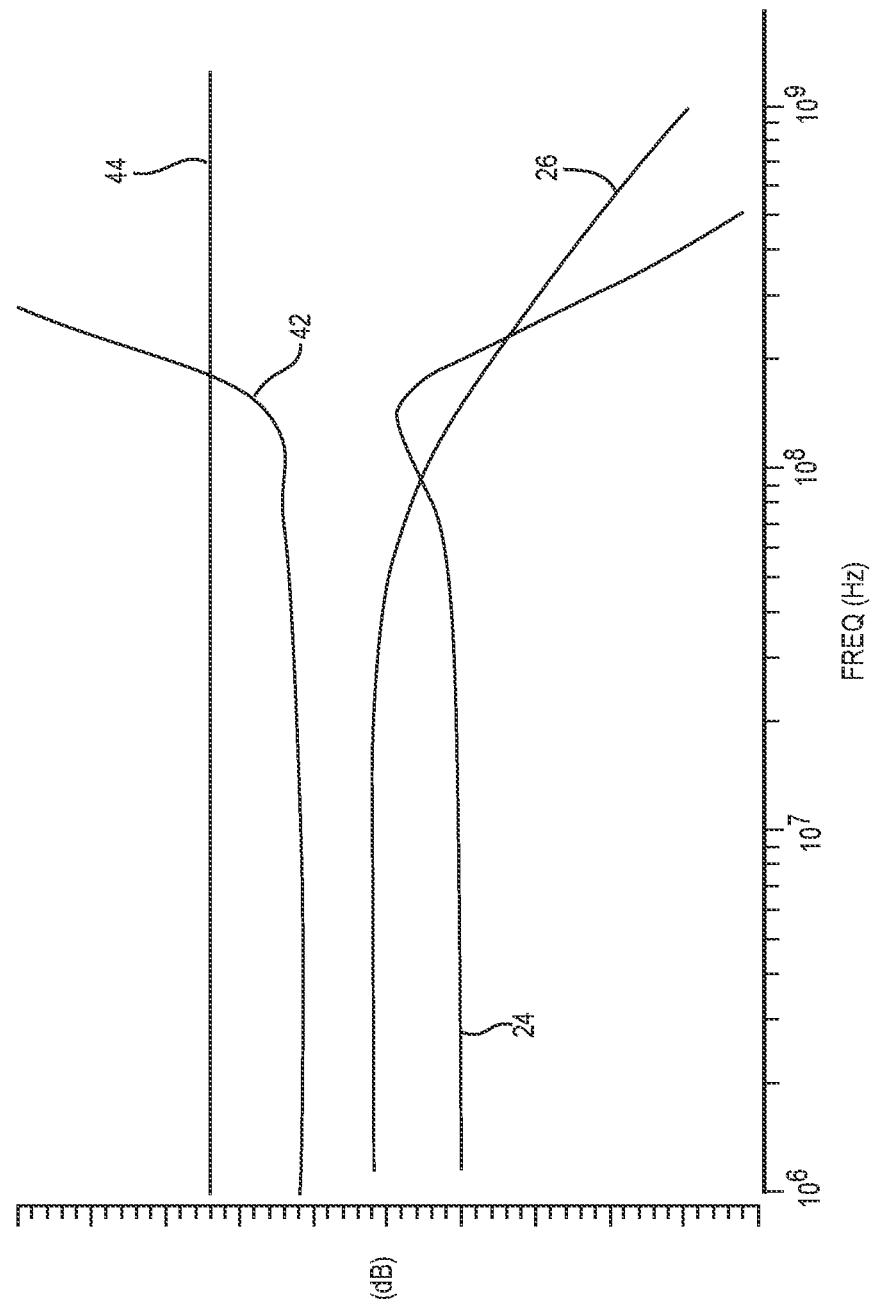
FIG. 5 is a graphic diagram providing an exemplary illustration as to how the power management circuit of FIG. 4 can effectively reduce the voltage disturbance as shown in FIG. 3 based on the second-order complex-zero transfer function with the real-zero term to offset voltage disturbance in the ET voltage.

FIG. 5 is a graphic diagram providing an exemplary illustration as to how the equalizer circuit 40 in the power management circuit 28 of FIG. 4 can effectively reduce the voltage disturbance as shown in FIG. 3 based on the second-order complex-zero transfer function H(s) with the real-zero term. Common elements between FIGS. 3 and 5 are shown therein with common element numbers and will not be re-described herein.

FIG. 5 further illustrates a third transfer function curve 42 and a fourth transfer function curve 44. Specifically, the third transfer function curve 42 represents the second-order complex-zero transfer function H(s) with the real-zero term as implemented by the equalizer circuit 40. The fourth transfer function curve 44 represents an overall transfer function of the power management circuit 28. As shown by the almost-flat fourth transfer function curve 44, the power management circuit 28 can effectively eliminate the voltage disturbance caused by the equivalent trace inductance $L_{TRACE}$ and the equivalent inductance $L_{ETIC}$ as a result of implementing the second-order complex-zero transfer function H(s) with the real-zero term represented by the third transfer function curve 42.

Figure 6:
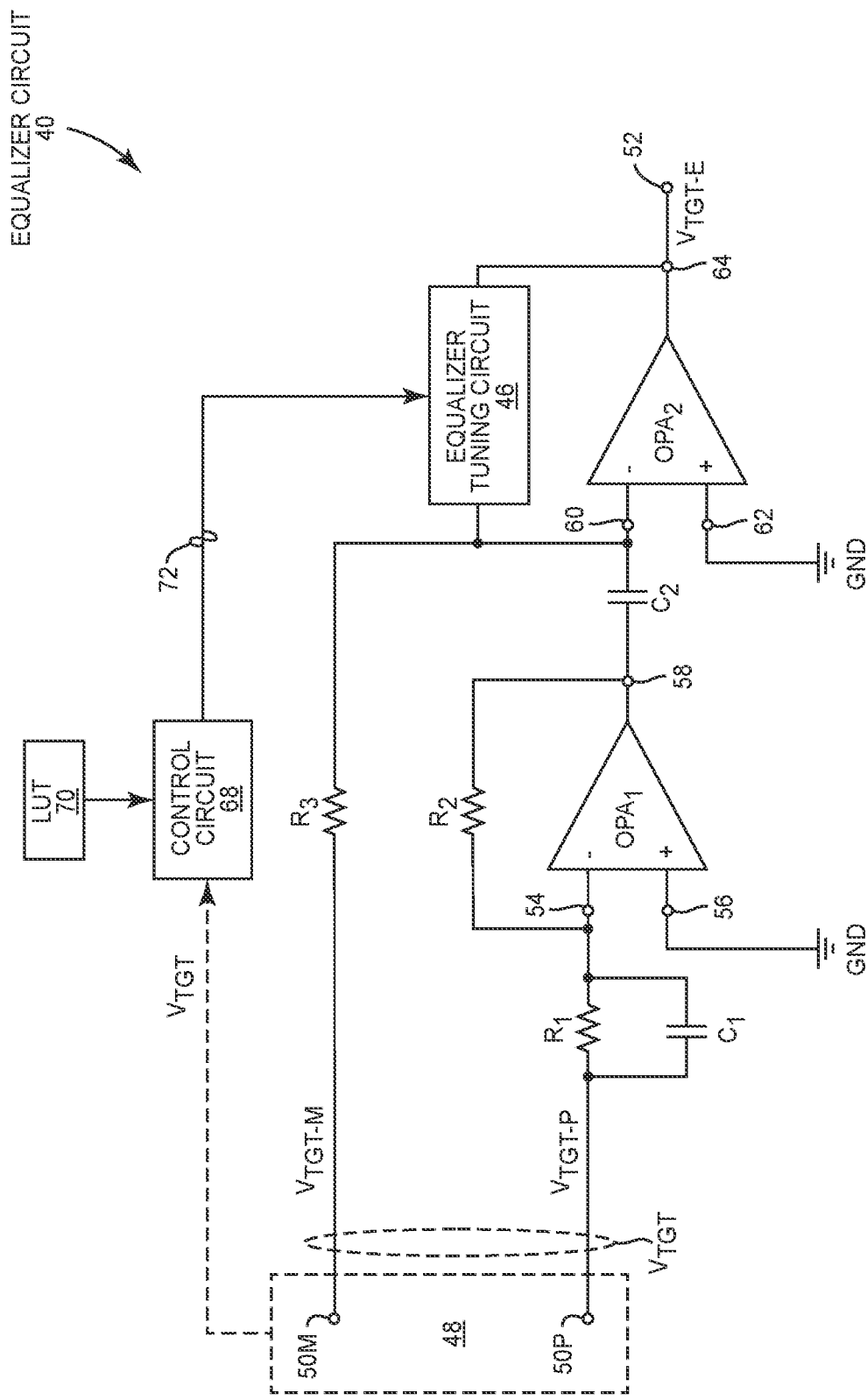
FIG. 6 is a schematic diagram providing an exemplary illustration of an equalizer circuit in the power management circuit of FIG. 4 configured according to an embodiment of the present disclosure to implement the second-order complex-zero transfer function with a real-zero term to offset voltage disturbance in the ET voltage.

FIG. 6 is a schematic diagram providing an exemplary illustration of the equalizer circuit 40 in the power management circuit 28 of FIG. 4 configured according to an embodiment of the present disclosure to implement the second-order complex-zero transfer function H(s) with the real-zero term. Common elements between FIGS. 4 and 6 are shown therein with common element numbers and will not be re-described herein.

U.S. patent application Ser. No. 17/142,350 (hereinafter "App'350"), entitled "EQUALIZER FOR ENVELOPE POWER SUPPLY CIRCUITRY," disclosed equalizer circuitry that can effectively offset the second-order complex-zero transfer function of the equivalent trace inductance $L_{TRACE}$. The equalizer circuit 40 discussed herein differs from the equalizer circuitry in App'350 in that the equalizer circuit 40 can further offset the real-zero term of the equivalent inductance $L_{ETIC}$. The equalizer circuit 40 further differs from the equalizer circuitry in App'350 in that the equalizer circuit 40 includes an equalizer tuning circuit 46, which may be controlled (e.g., based on modulation bandwidth of the RF signal 38) to change the transfer function H(s) of the equalizer circuit 40.

The equalizer circuit 40 includes a voltage input 48 that receives the differential target voltage $V_{TGT}$, which includes a negative target voltage $V_{TGT-M}$ and a positive target voltage $V_{TGT-P}$. In a non-limiting example, the voltage input 48 includes a negative target voltage input 50M for receiving the negative target voltage $V_{TGT-M}$ and a positive target voltage input 50P for receiving the positive target voltage $V_{TGT-P}$. The equalizer circuit 40 also includes a voltage output 52 that outputs the equalized target voltage $V_{TGT-E}$ corresponding to the differential target voltage $V_{TGT}$. The equalizer tuning circuit 46 is coupled between the voltage input 48 and the voltage output 52.

As discussed in detail below, the equalizer circuit 40 is configured to equalize the differential target voltage $V_{TGT}$ based on the second-order complex-zero transfer function H(s) with the real-zero term such that the equalized target voltage $V_{TGT-E}$ can offset the second-order complex-pole transfer function H(s) with the real-pole term.

The equalizer circuit 40 includes a first operational amplifier $OPA_1$ and a second operational amplifier $OPA_2$. The first operational amplifier $OPA_1$ includes a first inverting input node 54, a first non-inverting input node 56, and a first output node 58. The first inverting input node 54 is coupled to the positive target voltage input 50P via a first resistor R1 and a first capacitor C1, which are coupled in parallel with one another. A second resistor R2 is coupled between the first inverting input node 54 and the first output node 58. The first non-inverting input node 56 is coupled to a ground (GND). The second operational amplifier $OP_2$ includes a second inverting input node 60, a second non-inverting input node 62, and a second output node 64. The second inverting input node 60 is coupled to the first output node 58 via a second capacitor C2. Further, the second inverting input node 60 may be coupled to the negative target voltage input 50M via a third resistor R3, and additionally may be coupled to the second output node 64 via the equalizer tuning circuit 46. The second non-inverting input node 62 is coupled to the ground (GND). The second output node 64 may be coupled to the voltage output 52. While the equalizer circuit 40 is shown to only include the voltage output 52, it may also be possible for the equalizer circuit 40 to include an inverted voltage output node (not shown) in some embodiments such that the equalized target voltage $V_{TGT-E}$ can be a differential equalized target voltage. Specific details as to how the first operational amplifier $OPA_1$ and the second operational amplifier $OPA_2$ can implement a second-order complex-zero transfer function can be found in App'350 and will not be redescribed herein.

Figure 7:
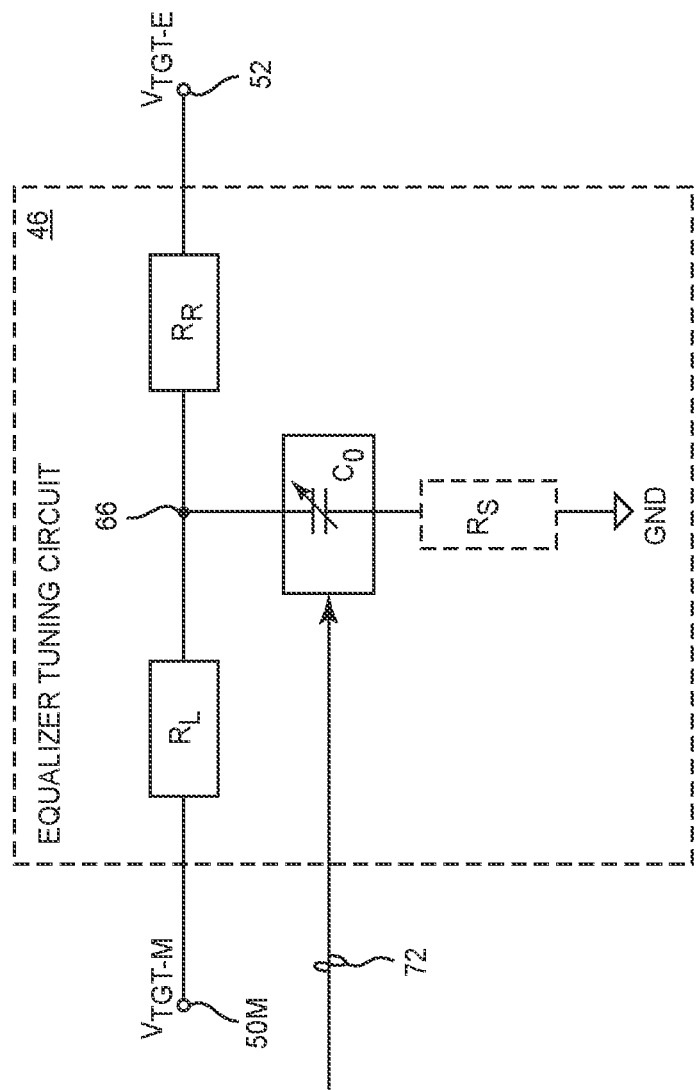
FIG. 7 is a schematic diagram providing an exemplary illustration of an equalizer tuning circuit provided in the equalizer circuit of FIG. 6.

In one embodiment, the equalizer tuning circuit 46 can be implemented based on a T-network configuration. FIG. 7 is a schematic diagram providing an exemplary illustration of the equalizer tuning circuit 46 in the equalizer circuit 40 of FIG. 6. Common elements between FIGS. 6 and 7 are shown therein with common element numbers and will not be re-described herein.

The equalizer tuning circuit 46 includes a left resistor $R_L$ and a right resistor $R_R$ coupled in series between the negative target voltage input 50M and the voltage output 52. The equalizer tuning circuit 46 also includes a tunable capacitor $C_O$ coupled between a coupling node 66, which is located between the left resistor $R_L$ and the right resistor $R_R$, and the ground (GND). As shown, the left resistor $R_L$, the right resistor $R_R$, the tunable capacitor $C_O$, and the shunt resistor Rs collectively form a T-network. In an embodiment, the equalizer tuning circuit 46 may further include a shunt resistor $R_S$ coupled between the tunable capacitor $C_O$ and the ground (GND).

With reference back to FIG. 6, by incorporating the equalizer tuning circuit 46 as shown in FIG. 7, the equalizer circuit 40 can realize the second-order complex-zero transfer function H(s) with the real-zero term as expressed in equation (Eq. 4) below.

$$H(s) = \frac{(R_L + R_R)}{R_3} * \left[1 + C_0\left(\frac{R_L * R_R}{R_L + R_R}\right) * s\right] * \quad \text{(Eq. 4)}$$
$$\left[1 + \left(R_3 * \frac{R_2}{R_1} * C_2\right) * s * (1 + R_1 * C_1 * s)\right]$$

As shown in the equation (Eq. 4), the transfer function H(s) includes a second-order complex-zero term $$\left[1 + \left(R_3 * \frac{R_2}{R_1} * C_2\right) * s * (1 + R_1 * C_1 * s)\right]$$

and a real-zero term $$\left[1 + C_0\left(\frac{R_L * R_R}{R_L + R_R}\right) * s\right].$$

As such, the transfer function H(s) realized by the equalizer circuit 40 can effectively offset the second-order complex-pole transfer function H(s) with the real-pole, as realized by the equivalent trace inductance $L_{TRACE}$ and the equivalent inductance $L_{ETIC}$.

Moreover, the equation (Eq. 4) shows that it is possible to change the real-zero term $$\left[1 + C_0\left(\frac{R_L * R_R}{R_L + R_R}\right) * s\right]$$

by changing a capacitance of the adjustable capacitor $C_O$. In this regard, in a non-limiting example, the equalizer circuit 40 can be configured to further include a control circuit 68 and a lookup table (LUT) 70 to statically or dynamically adjust the real-zero term $$\left[1 + C_0\left(\frac{R_L * R_R}{R_L + R_R}\right) * s\right]$$

via the tunable capacitor $C_O$.

In an embodiment, the LUT 70 may be preconfigured to establish a correlation between various capacitance values of the tunable capacitor $C_O$ and various modulation bandwidth of the RF signal 38. In this regard, when the control circuit 68, which can be a field-programmable gate array (FPGA) as an example, receive the differential target voltage $V_{TGT}$ (e.g., the negative target voltage $V_{TGT-M}$ and/or the positive target voltage $V_{TGT-P}$) indicating a specific modulating bandwidth of the RF signal 38, the control circuit 68 may retrieve a respective capacitance from the LUT 70 corresponding to the specific modulation bandwidth and set the tunable capacitor $C_O$ (e.g., via a control signal 72) to the respective capacitance retrieved from the LUT 70. As a result, it is possible to dynamically change the real-zero term $$\left[1 + C_0\left(\frac{R_L * R_R}{R_L + R_R}\right) * s\right]$$

between, for example, burst of symbols or frames.

Alternative to implementing the equalizer tuning circuit 46 based on the T-network configuration as shown in FIG. 7, it is also possible to implement the equalizer tuning circuit 46 based on a π-network configuration. In this regard, FIGS. 8A and 8B are schematic diagrams providing exemplary illustrations of alternative implementations of the equalizer tuning circuit 46 in FIG. 7.

Figure 8A:
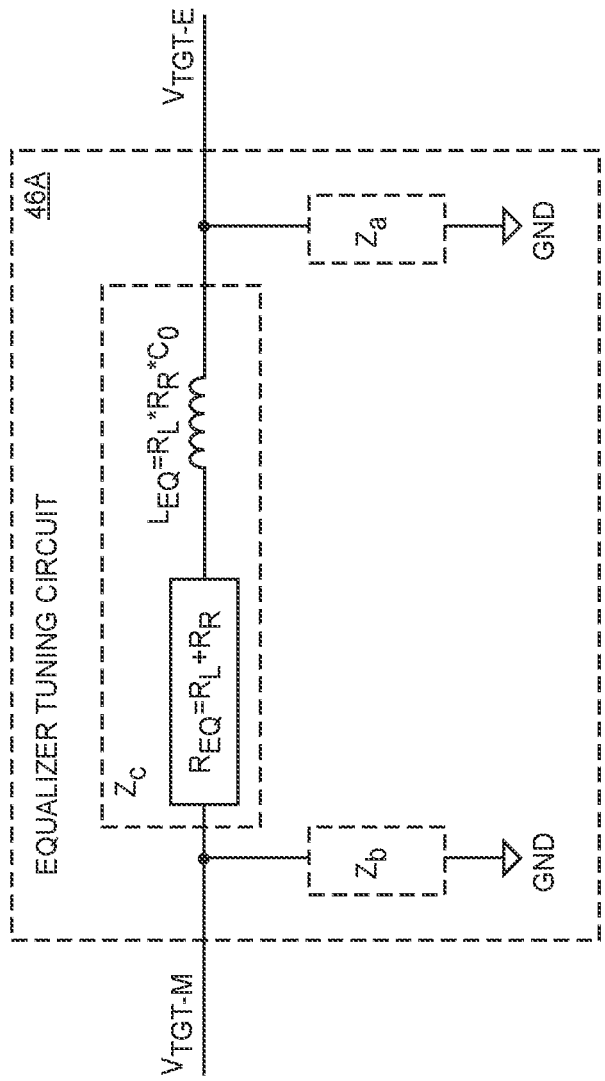
FIGS. 8A and 8B are schematic diagrams providing exemplary illustrations of alternative implementations of the equalizer tuning circuit in FIG. 7.
Figure 8B:
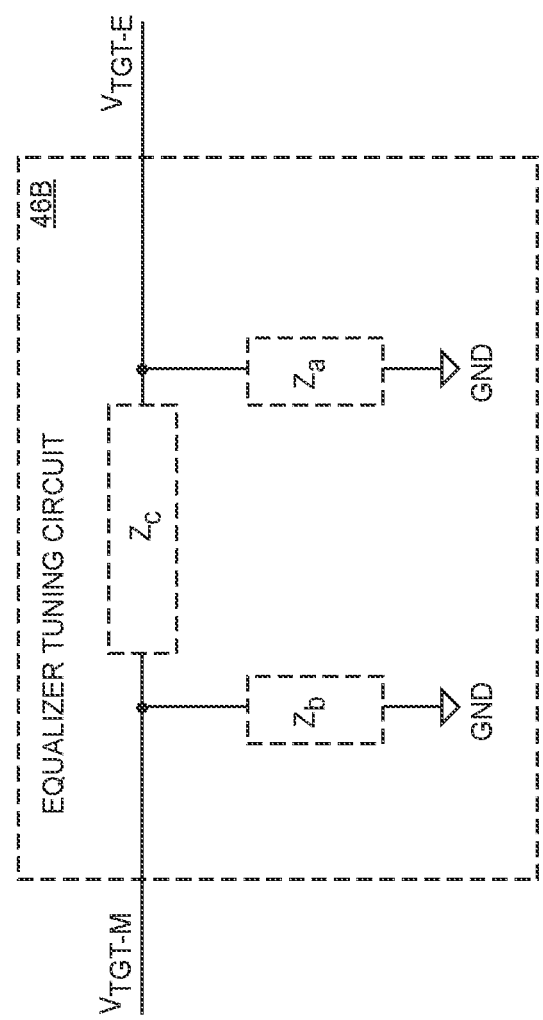

FIG. 8A is a schematic diagram providing an exemplary illustration of an equalizer tuning circuit 46A configured according to an alternative embodiment of the present disclosure to realize a transfer function H(s) including a real-zero term. The equalizer tuning circuit 46A can be functionally equivalent to the equalizer tuning circuit 46 in FIG. 7 without the shunt resistor $R_S$. As illustrated in FIG. 8A, the equalizer tuning circuit 46A is configured according to a π-network configuration that includes impedance $Z_a$, $Z_b$, and $Z_c$. The impedance $Z_a$, $Z_b$, and $Z_c$ can be determined based on equations (Eq. 5.1-5.3) below.

$$Z_a = \frac{ZR_L * ZR_R + ZR_R * ZC_0 + ZR_L * ZC_0}{ZR_L} \quad \text{(Eq. 5.1)}$$

-continued $$Z_b = \frac{ZR_L * ZR_R + ZR_R * ZC_0 + ZR_L * ZC_0}{ZR_R} \quad \text{(Eq. 5.2)}$$

$$Z_c = \frac{ZR_L * ZR_R + ZR_R * ZC_0 + ZR_L * ZC_0}{ZC_0} \quad \text{(Eq. 5.3)}$$

In the equations (Eq. 1-Eq. 3) above, $ZR_L$, $ZR_R$, and $ZC_0$ represent equivalent impedance of the left resistor $R_L$, the right resistor $R_R$, and the tunable capacitor $C_0$ in FIG. 7, respectively. In an embodiment, the impedance $Z_c$ can be modeled by an equivalent resistor $R_{EQ}$ ($R_{EQ}=R_L+R_R$) coupled in series to an equivalent inductor $L_{EQ}$ ($L_{EQ}=R_L*R_R*C_0$). The equalizer tuning circuit 46 defines a real-zero term $[(R_L+R_R)+(R_L-R_R)*C_0*s]$.

FIG. 8B is a schematic diagram providing an exemplary illustration of an equalizer tuning circuit 46B configured according to another alternative embodiment of the present disclosure to realize a real-zero term and a real-pole transfer function. The equalizer tuning circuit 46B can be functionally equivalent to the equalizer tuning circuit 46 in FIG. 7 with the shunt resistor $R_S$. The equalizer tuning circuit 46B defines a real-zero term $[(R_L+R_R)+(R_L*R_R+(R_L+R_R)*R_S)*C_0*s]$ and a real-pole term $[1+R_S*C_0*s]$.

With reference back to FIG. 4, the voltage amplifier circuit 34 can include a voltage amplifier 74 (denoted as "VA") coupled in series to an offset capacitor $C_{OFF}$. The voltage amplifier 74 is configured to generate an initial ET voltage $V_{AMP}$ based on the equalized target voltage $V_{TGT-E}$. The offset capacitor $C_{OFF}$ may be charged by a low-frequency current IDC to raise the initial ET voltage $V_{AMP}$ by an offset voltage $V_{OFF}$ to generate the ET voltage $V_{CC}$ ($V_{CC}=V_{AMP}+V_{OFF}$). The voltage amplifier circuit 34 may include a feedback path 76, which can provide a feedback of the ET voltage $V_{CC}$ to the voltage amplifier 74.

The power management circuit 28 can include a multi-level charge pump (MCP) 78 coupled in series to a power inductor 80. The MCP 78 may be controlled (e.g., based on the differential target voltage $V_{TGT}$) to generate a low-frequency voltage $V_{DC}$ at multiple levels based on a battery voltage $V_{BAT}$. For example, the MCP 78 may operate in a buck mode to generate the low-frequency voltage $V_{DC}$ at 0 V or $V_{BAT}$. The MCP 78 may also operate in a boost mode to generate the low-frequency voltage $V_{DC}$ at $2*V_{BAT}$. The power inductor 80 is configured to induce the low-frequency current IDC based on the low-frequency voltage $V_{DC}$.

The power management circuit 28 may further include a processing circuit 82 coupled in between the equalizer circuit 40 and the voltage amplifier circuit 34. The processing circuit 82 may perform further signal processing (e.g., anti-aliasing) on the equalized target voltage $V_{TGT-E}$ prior to providing the equalized target voltage $V_{TGT-E}$ to the voltage amplifier circuit 34.

Those skilled in the art will recognize improvements and modifications to the preferred embodiments of the present disclosure. All such improvements and modifications are considered within the scope of the concepts disclosed herein and the claims that follow.

What is claimed is:
1. An equalizer circuit comprising:
a voltage input that receives a differential target voltage comprising a negative target voltage and a positive target voltage;
a voltage output that outputs an equalized target voltage corresponding to the differential target voltage; and
an equalizer tuning circuit coupled between the voltage input and the voltage output and configured to cause the equalized target voltage to be generated from the differential target voltage based on a transfer function comprising a second-order complex-zero term and a real-zero term.

2. The equalizer circuit of claim 1, wherein the equalizer tuning circuit comprises:
a left resistor and a right resistor coupled in series between the voltage input and the voltage output; and
a tunable capacitor provided between a ground and a coupling node in between the left resistor and the right resistor.

3. The equalizer circuit of claim 2, wherein the equalizer tuning circuit further comprises a shunt resistor coupled between the tunable capacitor and the ground.

4. The equalizer circuit of claim 2, further comprising a control circuit configured to adjust the tunable capacitor based on the differential target voltage to thereby adjust the real-zero term in the transfer function.

5. The equalizer circuit of claim 4, wherein the control circuit is further configured to:
retrieve a capacitance from a lookup table (LUT) based on a modulation bandwidth indicated by the differential target voltage; and
set the tunable capacitor to the capacitance retrieved from the LUT.

6. The equalizer circuit of claim 2, further comprising a first operational amplifier and a second operational amplifier coupled in series between the voltage input and the voltage output.

7. The equalizer circuit of claim 6, wherein the voltage input comprises a positive target voltage input that receives the positive target voltage and a negative target voltage input that receives the negative target voltage.

8. The equalizer circuit of claim 7, wherein:
the first operational amplifier comprises:
a first inverting input node coupled to the positive target voltage input;
a first non-inverting input node coupled to the ground; and
a first output node; and
the second operational amplifier comprises:
a second inverting input node coupled to the first output node and the negative target voltage input;
a non-inverting input node coupled to the ground; and
a second output node coupled to the voltage output.

9. The equalizer circuit of claim 8, wherein the equalizer tuning circuit further comprises:
a left node coupled to the second inverting input node of the second operational amplifier and to the negative target voltage input; and
a right node coupled to the voltage output;
wherein the left resistor and the right resistor are coupled in series between the left node and the right node.

10. A power management circuit comprising:
an equalizer circuit comprising:
a voltage input that receives a differential target voltage comprising a negative target voltage and a positive target voltage;
a voltage output that outputs an equalized target voltage corresponding to the differential target voltage; and
an equalizer tuning circuit coupled between the voltage input and the voltage output and configured to cause the equalized target voltage to be generated from the differential target voltage based on a transfer function comprising a second-order complex-zero term and a real-zero term; and a voltage amplifier circuit configured to generate an envelope tracking (ET) voltage based on the equalized target voltage.

11. The power management circuit of claim 10, wherein the equalizer tuning circuit comprises:

a left resistor and a right resistor coupled in series between the voltage input and the voltage output; and a tunable capacitor having a first end coupled to a coupling node located between the left resistor and the right resistor and a second end coupled to a ground.

12. The power management circuit of claim 11, wherein the equalizer tuning circuit further comprises a shunt resistor coupled between the second end of the tunable capacitor and the ground.

13. The power management circuit of claim 11, wherein the equalizer circuit further comprises a control circuit configured to adjust the tunable capacitor based on the differential target voltage to thereby adjust the real-zero term in the transfer function.

14. The power management circuit of claim 13, wherein the control circuit is further configured to:

retrieve a capacitance from a lookup table (LUT) based on a modulation bandwidth indicated by the differential target voltage; and set the tunable capacitor to the capacitance retrieved from the LUT.

15. The power management circuit of claim 11, wherein the equalizer circuit further comprises a first operational amplifier and a second operational amplifier coupled in series between the voltage input and the voltage output.

16. The power management circuit of claim 15, wherein the voltage input comprises a positive target voltage input that receives the positive target voltage and a negative target voltage input that receives the negative target voltage.

17. The power management circuit of claim 16, wherein: the first operational amplifier comprises:

a first inverting input node coupled to the positive target voltage input;

a first non-inverting input node coupled to the ground; and a first output node; and the second operational amplifier comprises:

a second inverting input node coupled to the first output node and the negative target voltage input;

a non-inverting input node coupled to the ground; and a second output node coupled to the voltage output.

18. The power management circuit of claim 17, wherein the equalizer tuning circuit further comprises:

a left node coupled to the second inverting input node of the second operational amplifier and to the negative target voltage input; and a right node coupled to the voltage output;

wherein the left resistor and the right resistor are coupled in series between the left node and the right node.

19. The power management circuit of claim 10, wherein the voltage amplifier circuit comprises:

a voltage amplifier configured to generate an initial ET voltage based on the equalized target voltage; and an offset capacitor configured to raise the initial ET voltage by an offset voltage to generate the ET voltage.

20. The power management circuit of claim 10, further comprising:

a multi-level charge pump configured to generate a low-frequency voltage at a plurality of voltage levels based on a battery voltage; and a power inductor configured to induce a low-frequency current based on the low-frequency voltage.

* * * * *